United States Patent [19]

Salmonson

[11] Patent Number: 5,801,924
[45] Date of Patent: Sep. 1, 1998

[54] METHOD AND APPARATUS FOR COOLING DAUGHTER CARD MODULES

[75] Inventor: Richard B. Salmonson, Chippewa Falls, Wis.

[73] Assignee: Cray Research, Inc., Eagan, Minn.

[21] Appl. No.: 604,888

[22] Filed: Feb. 22, 1996

[51] Int. Cl.⁶ ................................................. H05K 7/20
[52] U.S. Cl. .................................... 361/719; 29/739
[58] Field of Search ............................... 439/74, 75, 485, 439/908; 29/592.1, 593, 729, 739, 740; 174/16.3, 252; 165/80.3, 80.4, 185, 104.33; 62/259.2; 257/706, 707, 712–714, 723, 724; 361/690, 699, 702, 704, 717–719, 778, 784, 785, 790, 796

[56] References Cited

U.S. PATENT DOCUMENTS

| | | | |
|---|---|---|---|
| 4,547,834 | 10/1985 | Dumont | 361/386 |
| 5,130,768 | 7/1992 | Wu | 357/82 |
| 5,214,570 | 5/1993 | Shah | 361/412 |
| 5,235,347 | 8/1993 | Lee | 346/107 R |
| 5,291,371 | 3/1994 | Gruber | 361/705 |
| 5,311,060 | 5/1994 | Rostoker | 257/796 |
| 5,343,359 | 8/1994 | Morton | 361/707 |
| 5,467,251 | 11/1995 | Katchmar | 361/719 |
| 5,572,407 | 11/1996 | Sobhani | 361/719 |

*Primary Examiner*—Gerald P. Tolin
*Attorney, Agent, or Firm*—Schwegman, Lundberg, Woessner & Kluth, P.A.

[57] ABSTRACT

A method and apparatus for conductively cooling daughter card assemblies mounted to either an air or liquid cooled computer circuit module wherein the module has a cold plate and at least one mother board adjacent the cold plate. The module carries a number of daughter assemblies thereon adjacent the mother board. Each daughter card assembly has at least one daughter board which carries a number of electronic components on an element side of the board. A cooling side is disposed opposite the element side on the board. A thermally conductive plate has an inner side facing the mother board and an outer side opposite the inner side. The inner side has one or more projecting members extending perpendicularly towards the mother board. The daughter board is parallel to and in conductive contact with one side of the conductive plate. The module cold plate has a number of upstanding spacers projecting toward the mother board. A portion of the top of each spacer is exposed for receiving thereon one of the projecting members of the conductive plate in intimate conductive contact. Preferably, the conductive plate is sandwiched between the cooling sides of a pair of daughter boards. Heat generated by the electronic components on the daughter boards is transferred by conduction through the boards into the conductive plate. The heat conducts through the projecting members into the spacers and into the module cold plate. The heat is then carried away by the cooling medium flowing through the cold plate.

26 Claims, 9 Drawing Sheets

METHOD AND APPARATUS FOR COOLING DAUGHTER CARD MODULES

STATEMENT REGARDING GOVERNMENT RIGHTS

The present invention was made with government support under MDA 972-95-3-0032, awarded by ARPA. The Government has certain rights in this invention.

FIELD OF THE INVENTION

The present invention relates to computer circuit modules and more specifically to a method and apparatus for conductively cooling daughter card assemblies carried on processor element circuit modules.

BACKGROUND OF THE INVENTION

High speed electronic digital computers of the type produced by Cray Research, Inc., the assignee hereof, generally utilize densely packaged or stacked banks of circuit modules. In general there are clock modules and processor element modules (PEM) of a computer. A typical PEM has at least one printed circuit board assembly mounted to a heat sink or "cold plate". The cold plate may be either a liquid cooled or air cooled version depending on the cooling system of the computer into which the PEM is installed.

A liquid cooled PEM generally has a pair of printed circuit board assemblies mounted to the cold plate which is sandwiched between the two boards. An air cooled PEM has only one printed circuit board attached thereto. Computer processor elements such as memory, logic, and integrated circuit devices are carried on the printed circuit boards including a number of memory daughter boards or daughter card assembles. These devices generate heat when operating which is transferred to the cold plate and carried away.

Proper cooling is essential in supercomputers; excess heat can build up, causing malfunction and failure of integrated circuits and other electrical components. The importance of effective and efficient cooling for each application grows as circuit board assemblies become smaller and more densely packed with ever faster and smaller components. Cooling of the daughter card assemblies is no exception.

In today's competitive market, the computer industry is driven to reduce the size and increase the speed of computers and components, reduce the number of parts and part variations, reduce manufacturing and assembly complexity, and reduce manufacturing, assembly and part costs. One of the ways the industry has used to achieve these goals is to produce standardized, interchangeable components and modular assemblies to eliminate the prior practice of using custom designed components.

Daughter cards are mounted on the surface of each printed circuit board opposite the cold plate and usually carry a number of logic integrated circuits and memory DRAM thereon. Cooling of these devices is difficult since they are remotely mounted from the cold plate. Conductive cooling is much more efficient than convection or radiation but requires a direct conductive path or contact between the heat generating components and the heat sink.

One method and apparatus which provides such conductive cooling of remotely mounted daughter cards is disclosed in U.S. Pat. No. 5,343,359, assigned to the assignee of the present invention. The '359 patent discloses a daughter card having electronic elements mounted on both sides with each being connected to copper stand-off bars by copper vias running within the daughter board itself. This construction requires more stand-off bars and more vias to increase the cooling capacity. Daughter cards of this type are typically custom designed to meet the cooling requirements of a particular computer application.

What is needed is a method and apparatus for conductively transferring heat generated by integrated circuit devices of a daughter card assembly to the cold plate of a computer circuit module. What is also needed is such a method and apparatus having relatively high conductive cooling capacity while being adaptable to today's densely packed, smaller, high speed circuits and modules. What is further needed is a method and apparatus adaptable to a standard daughter card assembly which may be used in either liquid cooled or air cooled computers.

SUMMARY OF THE INVENTION

The present invention is for a method and apparatus for providing a thermal conductive path from a daughter card assembly to a cold plate of a circuit module for heat generated by the electronic memory components on the daughter card assembly.

The apparatus of the present invention is a daughter card assembly with at least one printed circuit board or daughter board which carries a number of electronic elements on an element side of the board. A cooling side is disposed on the other side of the daughter board. The daughter card assembly has a thermal conductive plate abutting the cooling side of the daughter board so that the plate and board are generally parallel to one another and in thermal conductive contact. The conductive plate has an inner side facing the mother board and an outer side opposite the inner side. One or more integrally formed projecting members extend perpendicularly from the inner side toward the mother board and conductively contact the module cold plate.

In one embodiment, the apparatus includes a pair of daughter boards placed parallel to one another and having the conductive plate disposed between the cooling sides of each board. One of the boards abuts against the inner side of the plate and the other board abuts against the outer side. The conductive plate has four projecting members spaced apart around the perimeter of the plate.

The method of the invention includes providing a number of upstanding spacers on the module cold plate which project towards the mother board. A portion of the top of each spacer is exposed and the daughter card assembly is mounted to the module with each projecting member of the conductive plate abutting the top of one of the spacers. Heat generated by the electronic elements on each daughter board is transferred by conduction directly through each daughter board to the conductive plate. The heat then conducts through the projecting members into the spacers and then into the cold plate of the module. The cooling medium of the cold plate, either liquid coolant or air, will carry the heat away.

The method and apparatus of the invention provide a way to conductively cool a daughter card assembly having relatively high conductive cooling capacity. The method and apparatus of the invention may also be utilized with daughter card assemblies which are adapted for use in computers having densely packed, smaller, high speed circuit modules. The invention may also be utilized with standard daughter card assemblies adapted for use in either air cooled or liquid cooled computers.

DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

As used in conjunction with the present invention, "conductive" cooling means that substantially all of the heat energy is transferred from one physical body to another by direct contact. Although heat can also be transferred by convection and radiation from an electrical device, the present invention contemplates providing the primary heat transfer mode in the form of conduction which is typically far more effective and efficient than convection or radiation.

Figure 1:
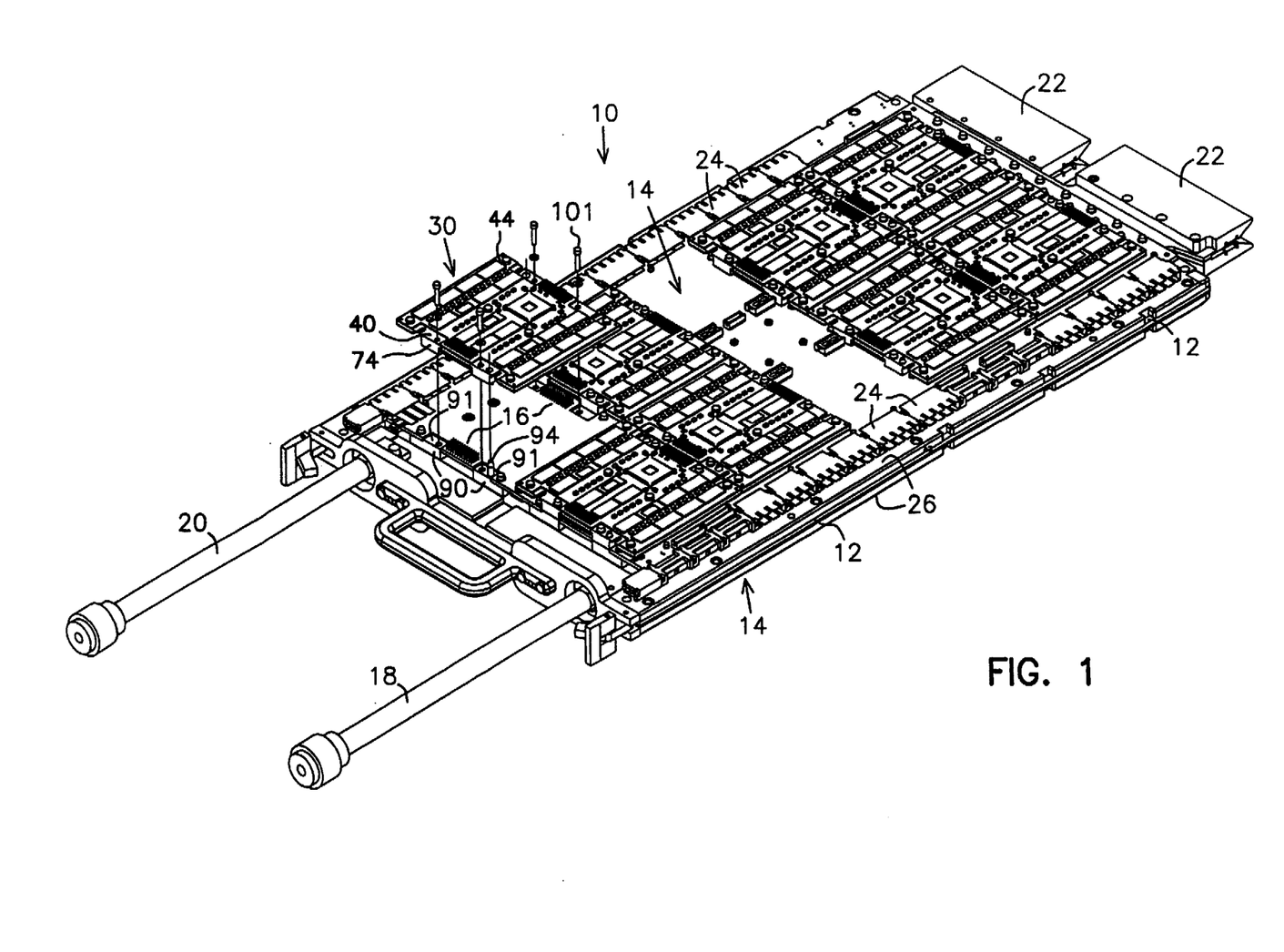
FIG. 1 is a top perspective view of a liquid cooled PEM illustrating installation of a number of daughter cards assemblies constructed in accordance with the present invention.
Figure 9:
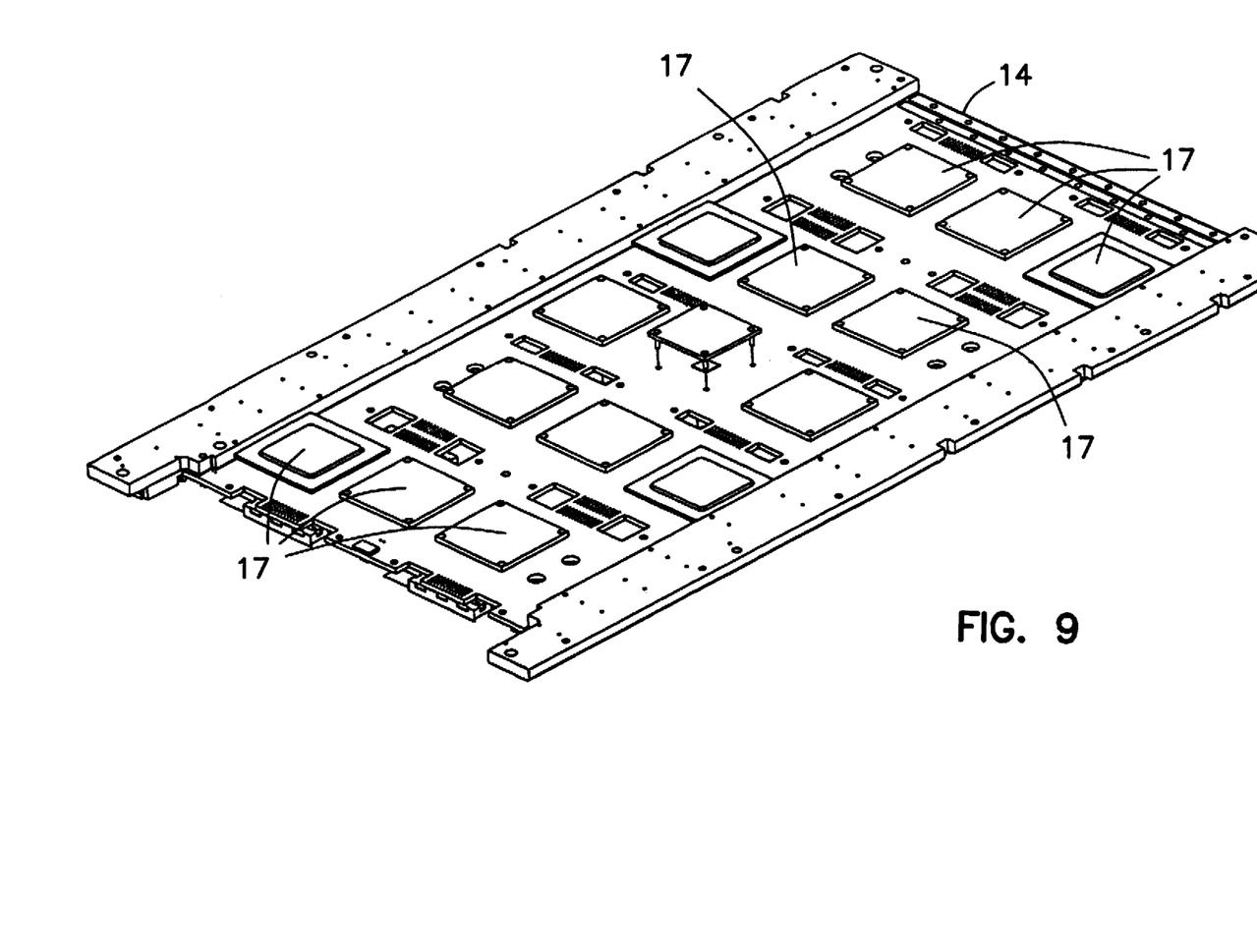
FIG. 9 is a view of the mother board on the side adjacent the cold plate.

Referring now to the drawings, FIG. 1 illustrates a liquid cooled computer circuit module 10 constructed in accordance with the present invention. Module 10 has a liquid cooled cold plate 12 sandwiched between a pair of processor element circuit boards or mother boards 14 each preferably carrying thereon a number or circuit and logic devices 17 (as shown in FIG. 9) on the side adjacent cold plate 12. A plurality of electrical connector pin arrays 16 preferably extend perpendicularly upward from each mother board 14 and electrically connect to the various electronic devices on the other side of the mother boards by conventional means.

In one embodiment illustrated in FIG. 1, cold plate 12 is liquid cooled by a coolant flowing within the cold plate. The coolant flows from an inlet 18 through the cold plate 12 to an outlet 20. The heat generated by the various electronic devices of the module is transferred to cold plate 12 and carried away by the coolant. A pair of power connectors 22 are disposed at the opposite end of module 10 for mechanically and electrically connecting module 10 to modular power supplies (not shown). The construction of cold plate 12 and power connectors 22 is known in the art and will not be further described herein.

The construction of both mother boards 14 in the present embodiment is essentially identical. Reference will be made herein to only one of mother boards 14 for simplicity of illustration but as will be evident to one of ordinary skill in the art, the details described herein will be applicable to both of the mother boards.

Mother board 14 in the embodiment of FIG. 1 has a plurality of conventional female edge connectors 24 disposed on opposite edges of the mother board, each being carried on a connector mounting rail 26 attached to the edge of the mother board. Details of the construction and operation of mounting rails 26 is described in co-pending U.S. patent application Ser. No. 08/605,356, filed herewith and, assigned to the assignee of the present invention. Its description of the construction and operation of these mounting rails is incorporated herein by reference. Connectors 24 engage male connector pins (not shown) mounted to the side panels of a computer cabinet (also not shown) for transmitting and receiving electrical signals to and from other modules and electrical devices of the computer. It is to be understood that any number of cold plate, power connection, and electronic connection configurations may be used without departing from the scope of the present invention.

A plurality of memory modules or daughter card assemblies 30 constructed in accordance with the present invention are connected to mother board 14 for transmitting and receiving electrical signals to and from the electronic devices carried on the mother board. Details of construction, assembly and installation of daughter card assemblies 30 are described in detail below.

Figure 2:
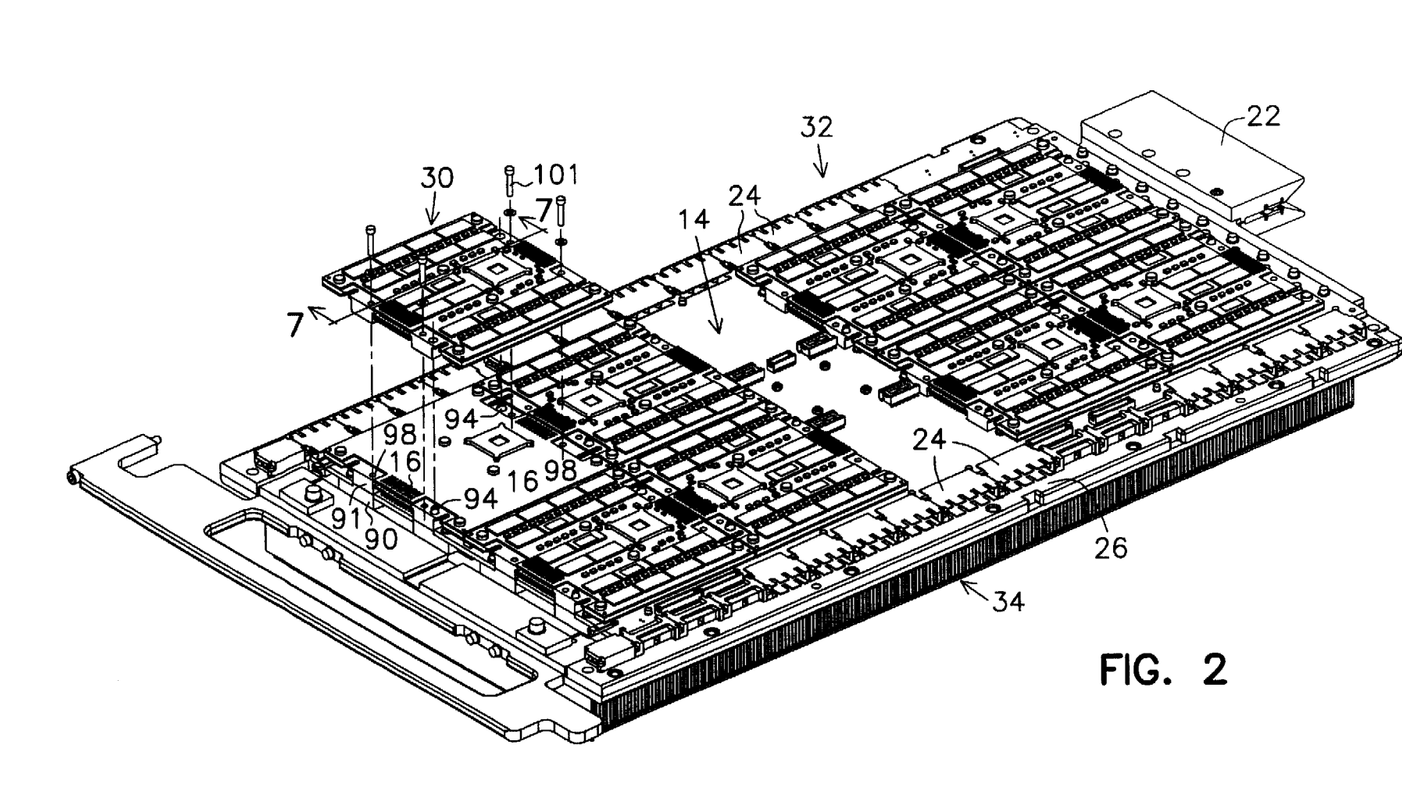
FIG. 2 is a top perspective view of an air cooled PEM illustrating the installation of a number of the daughter card assemblies of FIG. 1.

FIG. 2 illustrates an alternative embodiment of a computer circuit module constructed in accordance with the present invention. An air cooled circuit module 32 has an air cooled cold plate 34 and one mother board 14 carried thereon. Mother board 14 of module 32 is preferably of the same construction as mother board 14 of module 10. A typical air cooled module 32 has only one mother board 14 mounted thereto whereas a typical liquid cooled module 10 may have one or two mother boards attached thereto. The embodiments of FIGS. 1 and 2 illustrate one of the advantages of the present invention; daughter card assembly 30 is adaptable to either an air cooled or a liquid cooled computer circuit module.

Figure 3:
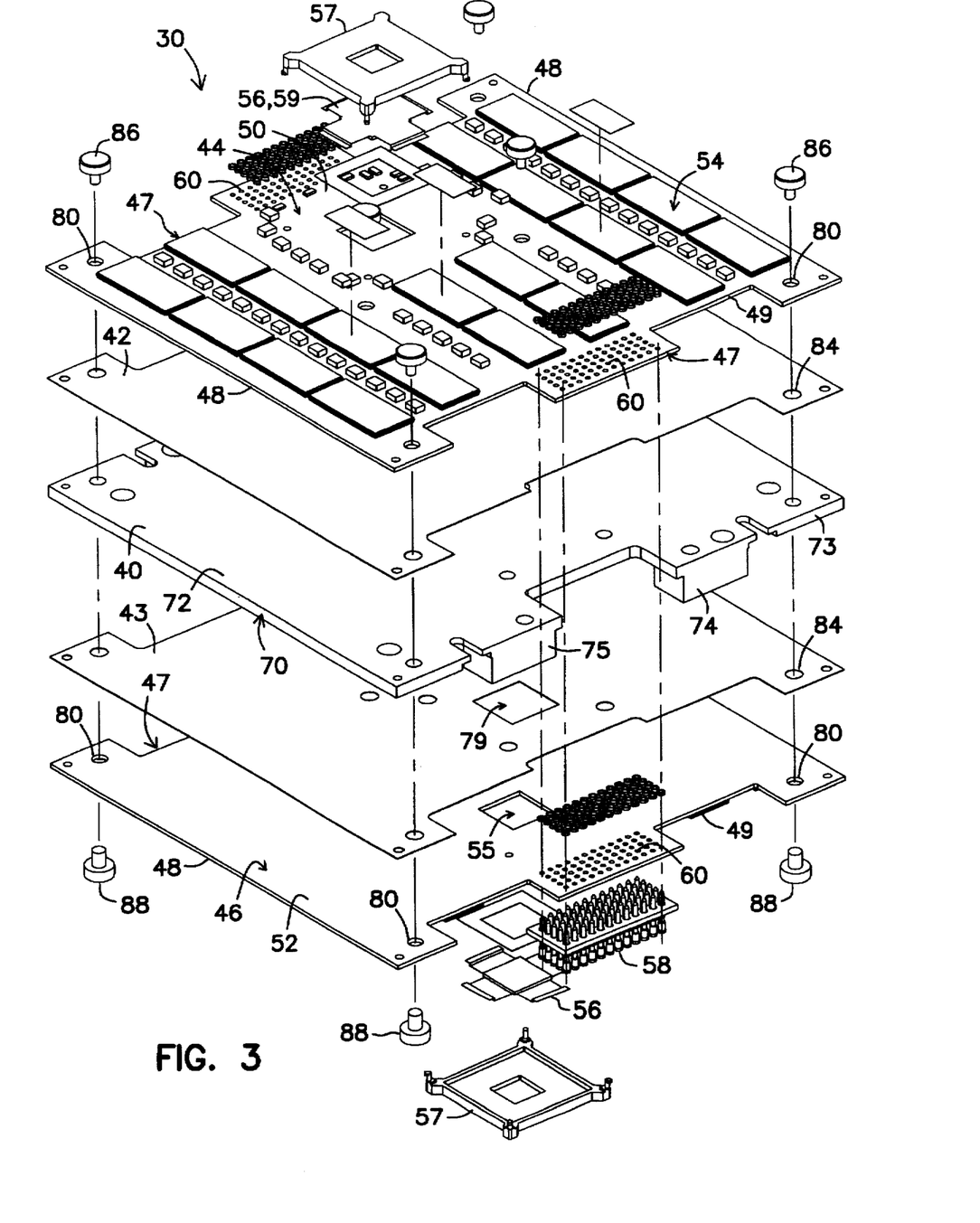
FIG. 3 is a partially exploded top perspective view of one of the daughter card assemblies of FIG. 1.
Figure 4:
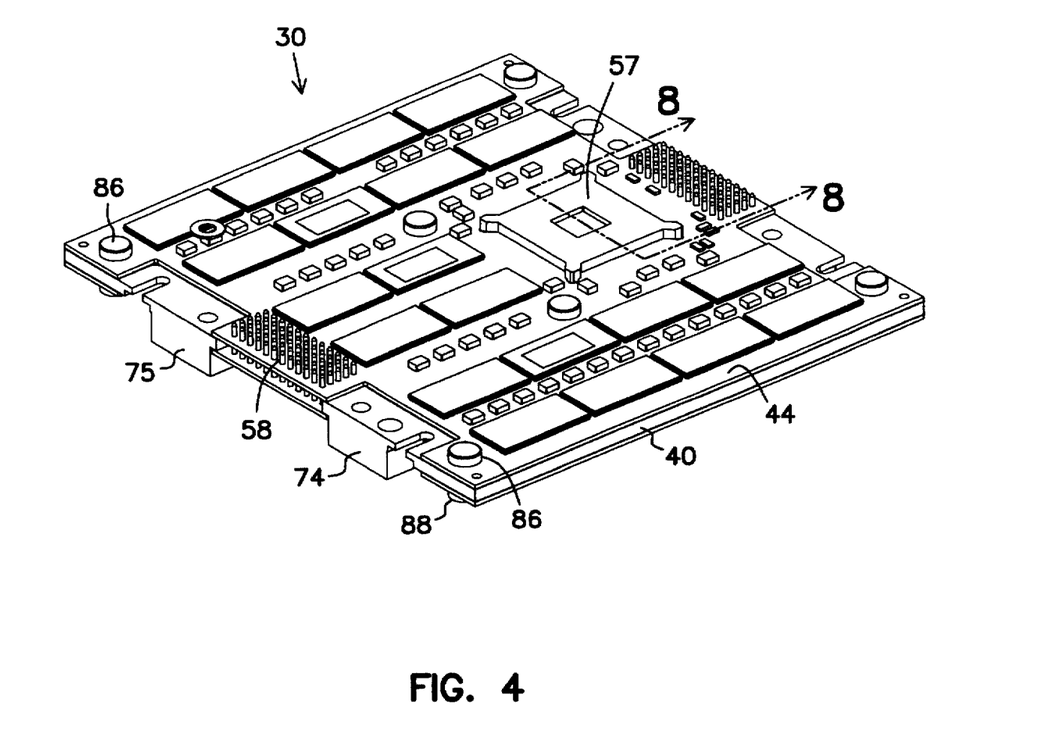
FIG. 4 is a top perspective view of the assembled daughter card of FIG. 3.
Figure 5:
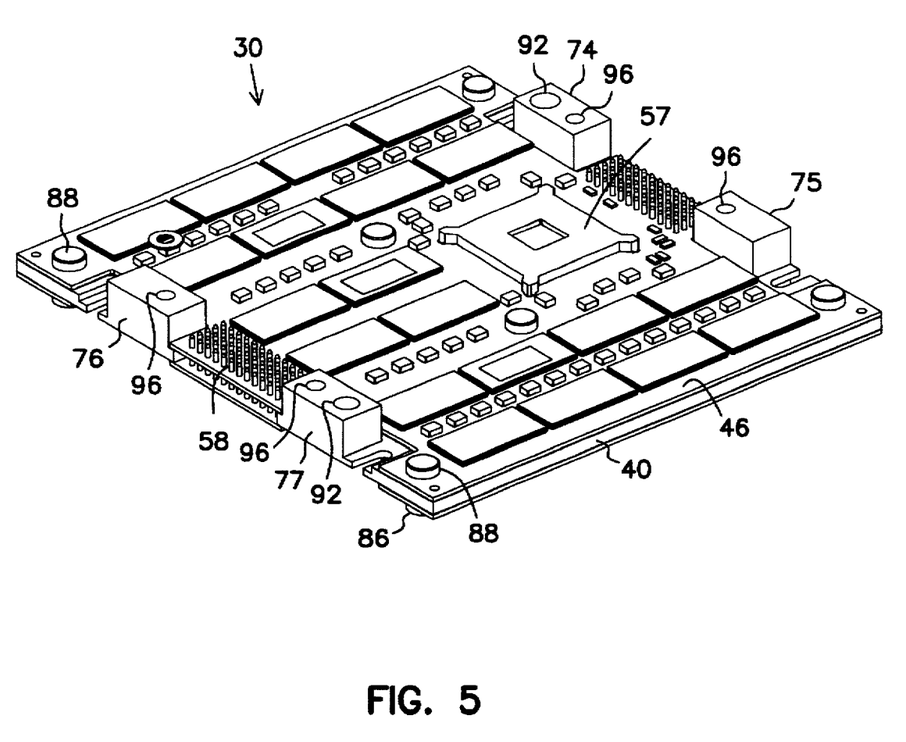
FIG. 5 is a bottom perspective view of the daughter card of FIG. 3.

One embodiment of a daughter card assembly 30 constructed in accordance with the present invention is illustrated in the exploded top perspective view of FIG. 3 and the top and bottom perspective views of FIGS. 4 and 5. Daughter card assembly 30 has a thermally conductive plate 40 sandwiched between a pair of thermal conductive shims 42 and 43. A pair of printed circuit boards or daughter boards 44 and 46 are assembled on opposite sides of conductive plate 40 adjacent conductive shims 42 and 43, respectively.

Although a pair of daughter boards 44 and 46 are illustrated in the preferred embodiment, daughter card assembly 30 may be constructed having only one daughter board. Daughter boards 44 and 46 are intended to have essentially the same construction but have been given different element numbers herein for clearly describing below the installation process of daughter card assembly 30 onto mother board 14.

Daughter boards 44 and 46 have a layered construction with each layer being fabricated from a metallic material such as copper and where a dielectric material such as FR-4 is disposed between each layer. Daughter boards 44 and 46 preferably have six copper layers; a top and bottom layer, an electrical power layer, a ground layer, and two signal layers. As an example, daughter boards 44 and 46 are presently constructed having a generally rectangular shape with dimensions of about 4.70 inches along the sides 47 and 4.30 inches along the ends 48. The thickness of daughter boards is about 0.035 inches±0.004 inches. As will be evident to those skilled in the art, the construction of the daughter board may take on any number of variations without departing from the scope of the present invention.

Daughter boards 44 and 46 each have a element side 50 facing away from conductive plate 40 and a cooling side 52 opposite the element side abutting shim 42. On both daughter boards 44 and 46, each of sides 47 of the present embodiment has a pair of bump cutouts 49 formed therein providing clearance for a portion of conductive plate 40 to be described below. A plurality of memory DRAM and/or integrated circuit components 54 are attached to element sides 50 of daughter boards 44 and 46 and are electrically connected by conventional means to the appropriate board layer. An opening 55 is formed in each of boards 44 and 46 receiving therein a logic integrated circuit 56 attached to each element side 50 and electrically connected to components 54 which in conjunction therewith provide the electronic circuit and memory functions of daughter card assembly 30. Each circuit 56 includes a lead frame 59 (FIG. 8) bonded to the circuit and soldered to its respective daughter board 44 or 46 for electrically connecting the circuit thereto and a plastic protective cover 57 for preventing damage to the circuit.

In one embodiment, a pair of electrical sockets 58 are positioned opposite one another on sides 47 of daughter boards 44 and 46. A socket receptacle 60 is formed in boards 44 and 46 between each pair of bump cutouts 49 on each side 47 of both boards. Socket receptacles 60 are constructed and arranged to electrically connect with components 54 and integrated circuit 56 of daughter boards 44 and 46 when sockets 58 are inserted therein. Sockets 58 are constructed to receive connector pin arrays 16 of mother board 14 therein when installing daughter card assembly 30. The connection between sockets 58 and pin arrays 16 provides the electronic signal paths between both daughter boards 44 and 46 and the mother board. The plug-in type electrical connection of sockets 58 and pin arrays 16 permits field serviceability of an individual daughter card assembly 30. A card assembly 30 may simply be unscrewed and unplugged from mother board 14 and removed for repair or replacement.

Sockets 58 are preferably constructed such that each socket is electrically connected to both daughter boards 44 and 46. Utilizing a socket 58 on opposite edges of both daughter boards 44 and 46 creates shorter electrical paths between the devices 54 and 56 on the boards and the devices on mother board 14. This results in faster electrical response therebetween. As will be evident to those skilled in the art, any number and configuration of electrical connector sockets and pin arrays may be used to make the signal connection between the daughter card assembly and the mother board without departing from the scope of the present invention.

In one embodiment, conductive plate 40 is sandwiched between daughter boards 44 and 46 for providing the improved heat transfer characteristics of the invention. Conductive plate 40 is preferably of a one piece solid construction formed from a material such as aluminum having high thermal conductivity. Aluminum 6061-T6 is the preferred material of the present embodiment. A wide variety of materials such as copper, alloys of copper or aluminum, or composite highly conductive materials could however be used to fabricate conductive plate 40 without departing from the scope of the present invention.

Figure 6:
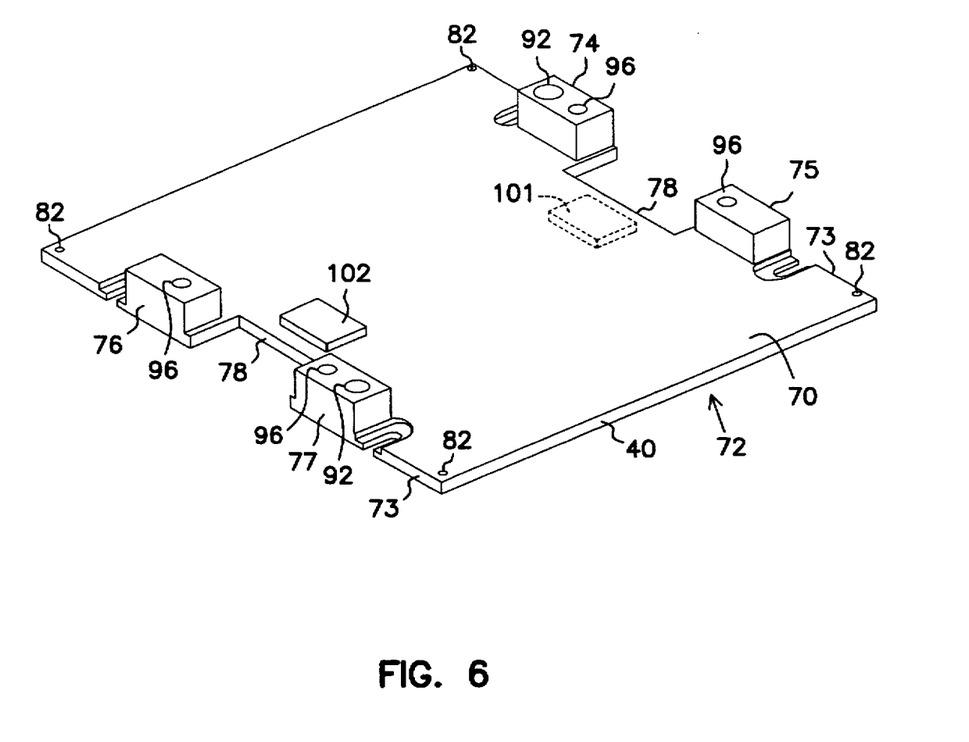
FIG. 6 is a bottom perspective view of the daughter card cold plate as illustrated in FIG. 3.

As best shown in FIG. 6, plate 40 has an inner side 70 which is adjacent to mother board 14 when daughter card assembly 30 is installed into module 10. Conductive plate 40 also has an outer side 72 generally parallel to inner side 70 and disposed on the opposite side. Outer side 72 is essentially planer or flat and receives thereon thermal conductive shim 42 and daughter board 44. Inner side 70 of the preferred embodiment is also essentially flat and receives thereon shim 43 and daughter board 46. Plate 40 has a pair of opposed sides 73 which coincide with sides 47 of daughter boards 44 and 46 when daughter card assembly 30 is assembled. Conductive plate 40 is preferably adapted to conductively transfer heat away from daughter card assembly 30 either directly from module 10 or to a heat sink such as cold plate 12 or 34 which will carry the heat from the module.

Inner side 70 also includes four projecting members or bumps 74, 75, 76, and 77 which are preferably formed integral with conductive plate 40 and intended to directly contact module cold plate 12 or 34 producing a direct thermal conductive path from plate 40 to the module cold plate as will be described below. The bumps are positioned such that a pair of bumps 74, 75 are spaced apart from one another adjacent one of sides 73 and a pair of bumps 76, 77 are spaced apart from one another adjacent the other of sides 73 on inner side 70.

When assembled, each of bumps 74, 75, 76 and 77 is received in its corresponding bump cutout 49 in board 46. Bump cutouts 49 in board 44 provide access clearance to the openings and bores formed in the bumps which are necessary for assembling daughter card assembly 30. Daughter boards 44 and 46 are intended to be interchangeable permitting either to be installed on either of sides 70 or 72 on conductive plate 40.

Each pair of bumps 74, 75 and 76, 77 are spaced apart from one another to provide mechanical stability for daughter card assembly 30 when mounted on mother board 14. In one embodiment, the bumps are not however positioned at the four corners of conductive plate 40 but instead positioned as shown in FIG. 6 spaced from each corner along sides 73. The span between each pair of bumps 74, 75 and 76, 77 is thus minimized preventing bowing or bending of plate 40 and daughter boards 44 and 46 between pair of bumps. Also, the heat conductive path from the corners, the center, or any point on conductive plate 40 is minimized by the positioning of the bumps shown in FIG. 6.

Thermal conductive shim 42 is preferably the same size and shape as daughter board 44 covering essentially the entire surface area of cooling side 52 of the daughter board when positioned adjacent thereto. Thermal shim 43 has a similar relationship to daughter board 46. However, as shown in FIG. 3 both thermal shims 42 and 43 have a socket cutout 78 for each of sockets 58 providing clearance for the sockets extending between boards 44 and 46 and for pin arrays 16 received therein. Each of shims 42 and 43 also include a circuit cutout 79 corresponding to openings 55 in boards 44 and 46 providing clearance for integrated circuit 56 to directly contact conductive plate 40, as will be described in detail below.

Shims 42 and 43 are preferably constructed from a material having high thermal conductivity and which is at least slightly compliant or compressible. When daughter card assembly 30 is assembled, the compliance of the conductive shims compensates for minor surface imperfections and flatness variations in cooling sides 52 of daughter boards 44 and 46 and inner side 70 and outer side 72 of conductive plate 40. Thus, shims 42 and 43 enhance the intimate conductive contact between the conductive plate and daughter boards. If the shims are not compliant or not present, intermittent conductive contact may occur between conductive plate 40 and cooling side 52 reducing the effective conductive surface area and hence the heat transfer efficiency of the plate.

Conductive plate 40 includes a cold bump 100 on inner side 70 and cold bump 101 on outer side 72. Cold bumps 100 and 101 correspond with and project through circuit cutouts 79 in shims 42 and 43 and openings 55 in boards 44 and 46 when daughter card 30 is assembled. Integrated circuits 56 abut against and are attached to the tops of cold bumps 100 and 101 by a thermally conductive epoxy 102 providing a direct cooling path from the circuits to the conductive plate.

Figure 8:
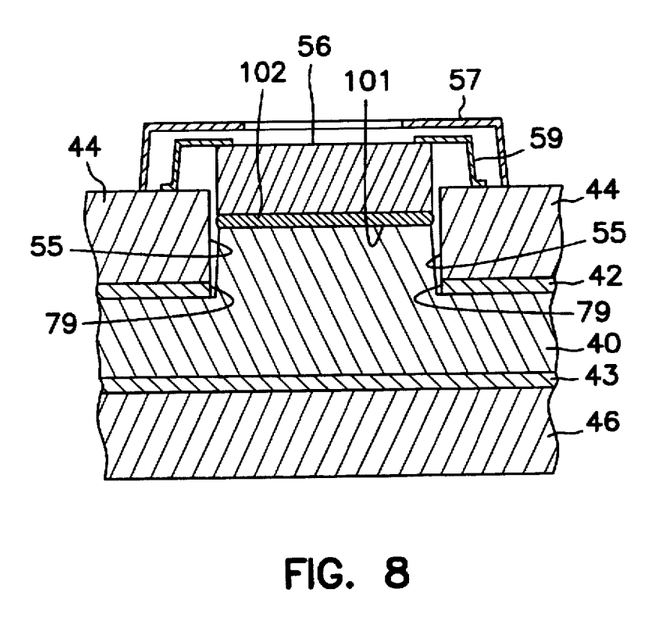
FIG. 8 is a partial sectional view taken along line 8—8 of FIG. 4 taken through one of the logic integrated circuits.

Shims 42 and 43 may also be provided having incrementally varying thicknesses to compensate for the dimensional tolerance variation between cold bumps 100 and 101 and boards 44 and 46. A consistent dimension is critical between the tops of cold bumps 100 and 101 and element side 50 of each of boards 44 and 46 to avoid buckling the corners of lead frames 59 preventing short circuits. FIG. 8 best illustrates that varying shim thicknesses may be used to compensate for height tolerance variations in boards 44 and 46 and cold bumps 100 and 101. Since it is desirable to densely package the components within a computer, controlling any spacial gaps between components to a minimum dimension is very important. Co-pending U.S. patent application Ser. No. 08/605,355, filed herewith and, assigned to the assignee of the present invention. That description is hereby incorporated herein by reference, discloses a method and apparatus of controlling such gaps utilizing easily identifiable thermal shims of incrementally varying thicknesses.

For assembly of daughter card assembly 30, six assembly openings 80 are formed in each of daughter boards 44 and 46 having one in each corner and two others disposed centrally within the daughter boards as can be seen in FIGS. 4 and 5. Six assembly bores 82 are formed in conductive plate 40 with one each corresponding to one of openings 80 in daughter boards 44 and 46. Six assembly openings 84 are also formed in each of thermal conductive shims 42 and 43 with one each corresponding to one of openings 80 and 82. When daughter card assembly 30 is assembled, the openings 80 and 84 and bores 82 at each corresponding location of daughter boards 44 and 46, thermal shims 42 and 43, and conductive plate 40 will concentrically align. Additionally, as shown in FIG. 8, circuits 56 are epoxied directly to the tops of cold bumps 100 and 101. The bumps 100 and 101 protrude through shim circuit cutouts 79 and board openings 55.

A threaded fastener having a threaded portion 86 and a corresponding tapped portion 88 is inserted through each series of corresponding openings and bores 80, 84 and 82 and torqued down to secure the components of daughter card assembly 30 together. It is intended that any number of attachment or fastening means may be used to assemble daughter card 30, including standard plastic push-in type fasteners, without departing from the scope of the present invention.

FIGS. 1 and 2 illustrate a number of daughter card assemblies 30 installed onto module 10 or module 32, respectively, with one card assembly in each figure being shown in partial exploded view. Liquid cooled cold plate 12 and air cooled cold plate 34 preferably have a plurality of upstanding spacers 90 projecting therefrom. The number and location of spacers 90 are preferably such that each of bumps 74, 75, 76 and 77 will abut one of spacers 90 when daughter card assemblies 30 are attached to module 10 for installing the card assembly and for providing the conductive path to the module cold plate.

In one embodiment, spacers 90 are used to attach mother board 14 to each module 10 or 32 as can be seen in FIGS. 1 and 2. A portion of the top 91 of each spacer 90 is left clear for abutment with one of bumps 74, 75, 76 or 77 of a daughter card assembly 30. An alignment opening 92 is formed through one of each pair of bumps 74, 75 and 76, 77 on each side 73 of conductive plate 40 for receiving therein a corresponding alignment pin 94 projecting upward from the top 91 of a spacer 90 for aligning or positioning each daughter card assembly 30 on module 10. It is preferred as shown in FIGS. 1 and 2 that at least two alignment openings 92 and pins 94 are provided for each daughter card assembly 30 to properly position and orient the daughter card relative to mother board 14.

Each bump 74, 75, 76 and 77 preferably also has one installation bore 96 formed therethrough for fastening each daughter card assembly 30 to module 10. Each spacer 90 has a corresponding tapped blind bore 98 formed therein. When daughter card assembly 30 is placed on module 10 with alignment pins 94 received in alignment openings 92, each bore 96 will align with its corresponding blind bore 98. A threaded fastener 101 is received through each bore 96 and screwed into tapped blind bore 98 to retain daughter card assembly 30 on module 10.

Figure 7:
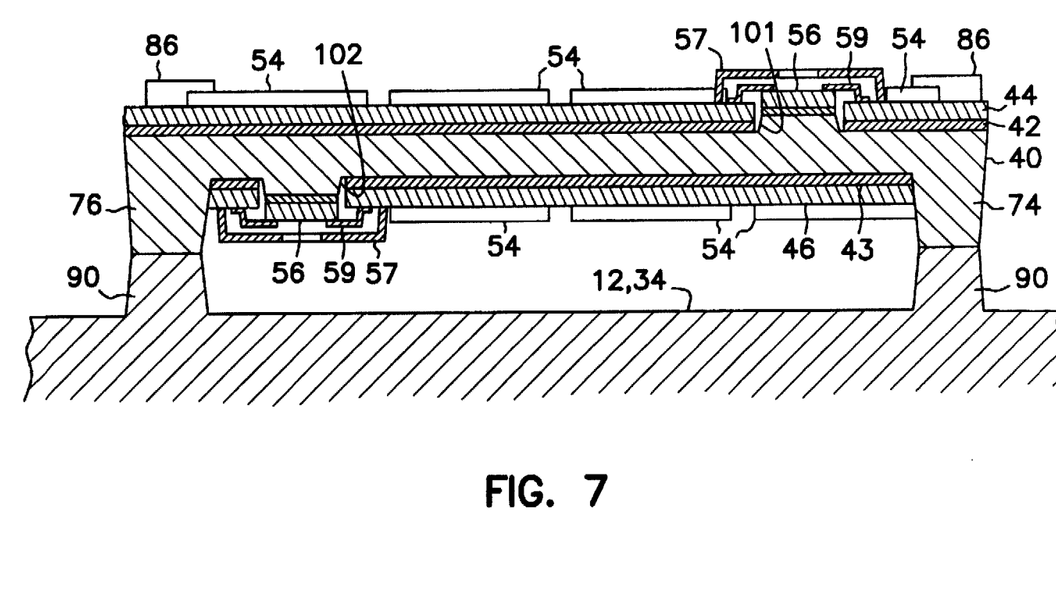
FIG. 7 is a sectional view through a portion of the air cooled PEM taken along line 7—7 of FIG. 2 illustrating the heat conductive path of the daughter card assembly.

The conductive cooling path from each daughter card assembly 30 to cold plate 12 or cold plate 34 is illustrated in FIG. 7. While the computer is operating, components 54 and logic circuits 56 on both daughter boards 44 and 46 will generate waste heat. Heat will transfer by conduction directly from the devices 54 through daughter board 44 and thermal conductive shim 42 and into conductive plate 40 through its outer side 72. Similarly, heat will conduct from devices 54 through daughter board 46 and thermal conductive shim 43 into the conductive plate through inner side 70. Additionally, heat will conduct from each of circuits 56 directly into its respective cold bump 100 and 101 and into conductive plate 40. The heat will transfer through conductive plate 40 to bumps 74, 75, 76 and 77 and into spacers 90 of the cold plate 12 or 34. The heat will then be transferred through the cold plates 12 or 34 and carried away by the coolant flowing through the liquid cold plate or the air flowing through the air cold plate.

Daughter card assembly 30 has improved heat conduction characteristics relative to prior art daughter cards. Hence, the invention provides better cooling of daughter card assemblies by incorporating a heat conductive surface area which coincides with the surface area of the daughter boards. Heat generated anywhere on either of the daughter boards has a direct conductive path to the conductive plate which provides much better thermal conduction than the limited conductive paths formed within the layers of the prior art daughter boards.

The daughter card assembly of the invention has a high conductive cooling capacity permitting installation of more electronic devices and circuits per daughter card and use in today's smaller, faster and more densely packed computers. The daughter card is standardized in that it may be installed in both liquid and air cooled computer applications and provide adequate cooling in either. The daughter cards are each removable as a modular unit permitting service on one without having to tear down or send the entire computer module in for repair.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A circuit module, comprising:
 a mother board having a first surface carrying thereon a plurality of electronic elements and a second surface generally parallel to and disposed opposite said first surface,
 a module cold plate mounted adjacent to and essentially parallel with said first surface such that said module cold plate is nearer to said first surface than to said second surface,
 a daughter card assembly mounted adjacent to and generally parallel with said second surface of said mother board such that said daughter card assembly is nearer said second surface than said first surface, said daughter card assembly comprising:
  a first daughter board having an element side carrying thereon a plurality of electronic elements and a cooling side essentially parallel to and disposed opposite said element side, and
  a thermally conductive plate having an inner side facing said mother board and an outer side generally parallel to and opposite said inner side, wherein said thermally conductive plate is in thermal conductive contact with said first daughter board and wherein said thermally conductive plate includes a first projecting member extending from said conductive plate which conductively contacts said module cold plate for conductively transferring heat from said first daughter board to said cold plate.

2. The circuit module of claim 1 wherein said first projecting member extends generally perpendicularly from said inner side of said conductive plate.

3. The circuit module of claim 1 wherein said conductive plate further includes second, third and fourth projecting members, wherein said first and second projecting members are disposed spaced apart from one another adjacent a first edge of said inner side and said third and fourth projecting members are disposed spaced apart from one another adjacent a second edge opposite said first edge.

4. The circuit module of claim 3, wherein the module cold plate includes a plurality of upstanding spacers projecting from said module cold plate, each spacer abutting against one of said projecting members.

5. The apparatus of claim 4 wherein said daughter card assemblies are mounted to said module cold plate by removably attaching said projecting members of said conductive plate to said upstanding spacers.

6. The circuit module of claim 1, wherein the module cold plate includes an upstanding spacer projecting from said module cold plate and abutting against said at least one projecting member.

7. The circuit module of claim 1 wherein said daughter card assembly further comprises a second daughter board having an element side carrying thereon a plurality of electronic elements and a cooling side essentially parallel to and disposed opposite said element side, wherein said cooling side of said first daughter board abuts against said inner side of said conductive plate and said cooling side of said second daughter board abuts against said outer side of said conductive plate.

8. The circuit module of claim 7 further comprising a second daughter card assembly mounted to said second surface of said mother board.

9. The circuit module of claim 1 further including a thermal conductive shim sandwiched between said cooling side of said daughter board and said conductive plate.

10. The circuit module of claim 1 wherein said module cold plate is an air cooled cold plate.

11. The circuit module of claim 1 wherein said module cold plate is a liquid cooled cold plate.

12. A circuit module, comprising:
 a pair of mother boards each having a first surface carrying thereon a plurality of electronic elements and a second surface generally parallel to and disposed opposite said first surface,
 a cold plate sandwiched between said first surfaces of said pair of mother boards,
 a pair of daughter card assemblies, one each mounted adjacent to and generally parallel with said second surface of each of said mother boards, each of said daughter card assemblies comprising:
  a first daughter board having an element side carrying thereon a plurality of electronic elements and a cooling side essentially parallel to and disposed opposite said element side,
  a thermally conductive plate having an inner side facing said second surface of the adjacent mother board and an outer side generally parallel to and opposite said inner side, wherein said thermally conductive plate conductively contacts said first daughter board and includes a first projecting member extending from said conductive plate which conductively contacts said module cold plate for conductively transferring heat from said first daughter board to said cold plate.

13. The circuit module of claim 12 wherein each of said conductive plates further include second, third and fourth projecting members extending perpendicularly from said inner side, wherein said first and second projecting members are disposed spaced apart from one another adjacent a first edge of said inner side and said third and fourth projecting members are disposed spaced apart from one another adjacent a second edge opposite said first edge.

14. The circuit module of claim 12 wherein said daughter card assemblies further comprise a second daughter board having an element side carrying thereon a plurality of electronic elements and a cooling side essentially parallel to and disposed opposite said element side, wherein said cooling side of said first daughter board abuts against said inner side of said conductive plate and said cooling side of said second daughter board abuts against said outer side of said conductive plate.

15. The circuit module of claim 12 wherein the module cold plate includes an upstanding spacer projecting from said module cold plate, wherein said first projecting member is removably attached to and in conductive contact with said upstanding spacer.

16. A circuit module, comprising:
 a mother board having a first surface carrying thereon a plurality of electronic elements and a second surface generally parallel to and disposed opposite said first surface,
 a module cold plate mounted adjacent to and essentially parallel with said first surface such that said module cold plate is nearer to said first surface than to said second surface,
 a plurality of daughter card assemblies each being mounted adjacent to and generally parallel with said second surface of said mother board such that said daughter card assembly is nearer said second surface than said first surface, each of said daughter card assemblies comprising:
  first and second daughter boards, wherein each daughter board has an element side carrying thereon a plurality of electronic elements and a cooling side essentially parallel to and disposed opposite said element side, a thermally conductive plate having an inner side facing said mother board and an outer side generally parallel to and opposite said inner side, wherein said cooling side of said first daughter board abuts against said inner side and said cooling side of said second daughter board abuts against said outer side of said conductive plate, and a plurality of projecting members spaced apart around the perimeter of and extending from and essentially perpendicular to said inner side of said conductive plate, wherein said projecting members contact said module cold plate for conductively transferring heat from said daughter card assembly to said module cold plate.

17. The circuit module of claim 16 wherein said projecting members include first, second, third and fourth projecting members extending perpendicularly from said inner side, wherein said first and second projecting members are disposed spaced apart from one another adjacent a first edge of said inner side and said third and fourth projecting members are disposed spaced apart from one another adjacent a second edge opposite said first edge.

18. The circuit module of claim 16, wherein each daughter card assembly further comprises a first thermal conductive shim sandwiched between said inner side of said conductive plate and said cooling side of said first daughter board and a second thermal conductive shim sandwiched between said outer side of said conductive plate and said cooling side of said second daughter board.

19. The circuit module of claim 16 wherein the module cold plate includes an upstanding spacer projecting from said module cold plate, wherein one of said projecting members is removably attached to and in conductive contact with said upstanding spacer.

20. A method of cooling daughter card assemblies comprising:

providing a cold plate, providing a mother board having a first side and a second side generally parallel with and opposite said first side, providing a thermally conductive plate having an inner side, an outer side generally parallel with said inner side, and one or more projecting members extending from said inner side, providing a first daughter board having an element side carrying thereon a plurality of electronic elements and a cooling side opposite said element side, assembling a daughter card assembly wherein the step of assembling a daughter card assembly includes the step of mounting said first daughter board to said conductive plate with said cooling side adjacent to and in conductive contact with said conductive plate, wherein the cooling side of said first daughter board is nearer said conductive plate than is the element side of said first daughter board, and assembling a module, wherein the step of assembling a module includes the steps of:

mounting said mother board to said cold plate with said first side adjacent said cold plate, wherein said first side is mounted nearer said cold plate than is said second side; and mounting said daughter card assembly adjacent said second side of said mother board such that said one or more projecting members conductively contact said cold plate.

21. The method of claim 20 wherein the step of providing a first daughter board further includes providing a second daughter board having an element side carrying thereon a plurality of electronic elements and a cooling side opposite said element side and the step of assembling a daughter card assembly further includes mounting said first daughter board to said conductive plate with said cooling side abutting said inner side and mounting said second daughter board to said conductive plate with said cooling side abutting said outer side.

22. The method of claim 20 wherein the step of providing a conductive plate further includes providing first, second, third and fourth projecting members extending perpendicularly from said inner side and positioned such that said first and second members are disposed spaced apart from one another adjacent a first edge of said inner side and said third and fourth members are disposed spaced apart from one another adjacent a second edge opposite said first edge.

23. The method of claim 22 wherein the cold plate includes a plurality of upstanding spacers and wherein the step of mounting said first daughter board includes the step of placing one of said projecting members in physical contact with one of said plurality of upstanding spacers.

24. The method of claim 21 wherein the step of assembling a daughter card assembly further includes placing a thermal conductive shim between said cooling side of said first daughter board and said inner side of said conductive plate and placing a thermal shim between said cooling side of said second daughter board and said outer side of said conductive plate.

25. The method of claim 20 wherein the method further includes the step of providing a second mother board having a first side, and having a second side generally parallel with an opposite said second side and wherein the step of assembling a module further includes the step of mounting said mother boards to said cold plate such that said cold plate is sandwiched between said first surfaces.

26. A method of cooling daughter card assemblies comprising:

providing a cold plate, providing a mother board having a first side and a second side generally parallel with and opposite said first side, providing a plurality of thermally conductive plates each having an inner side, an outer side generally parallel with said inner side, and a plurality of projecting members extending from said inner side, providing a plurality of daughter boards each having an element side carrying thereon a plurality of electronic elements and a cooling side opposite said element side, assembling a plurality of daughter card assemblies by mounting one of said daughter boards to each of said conductive plates with said cooling side abutting said inner side and mounting one of said daughter boards to each of said conductive plates with said cooling side abutting said outer side, wherein said cooling sides are nearer said conductive plates than are said element sides, and assembling a module by mounting said mother board to said cold plate having said first side adjacent to said cold plate and nearer said cold plate than said second side and by mounting said daughter card assemblies adjacent said second side of said mother board such that each of said projecting members conductively contacts said cold plate.

* * * * *